United States Patent

Terui et al.

[19]

[11] Patent Number: 6,055,500
[45] Date of Patent: Apr. 25, 2000

[54] INFORMATION TRANSFER, RECORDING AND REPRODUCING DEVICE

[75] Inventors: Nobuo Terui; Takafumi Ohnishi; Kenji Furuta, all of Hachioji, Japan

[73] Assignee: Olympus Optical Co., Ltd., Tokyo, Japan

[21] Appl. No.: 08/587,858

[22] Filed: Jan. 11, 1996

Related U.S. Application Data

[63] Continuation-in-part of application No. 08/417,944, Apr. 6, 1995, Pat. No. 5,510,924.

[30] Foreign Application Priority Data

Jul. 13, 1994 [JP] Japan .................................. 6-161440
Oct. 13, 1994 [JP] Japan .................................. 6-247851

[51] Int. Cl.$^7$ .............................. G10L 3/00; H04M 1/64
[52] U.S. Cl. ............................................ 704/270; 379/68
[58] Field of Search ............................ 395/2.79; 360/12, 360/15, 18, 22, 32, 39; 369/6–7, 20, 24–25; 359/143; 379/67, 68, 89; 704/201

[56] References Cited

U.S. PATENT DOCUMENTS

| | | | |
|---|---|---|---|
| 4,426,738 | 1/1984 | Sato .......................................... | 369/29 |
| 4,959,852 | 9/1990 | Kern et al. ................................ | 379/70 |
| 5,081,672 | 1/1992 | Mita et al. ................................ | 379/68 |
| 5,247,293 | 9/1993 | Nakagawa .......................... | 340/825.25 |
| 5,311,374 | 5/1994 | Oh ............................................ | 360/32 |
| 5,311,492 | 5/1994 | Tabuchi et al. ........................... | 369/47 |
| 5,365,503 | 11/1994 | Goto ........................................ | 369/32 |
| 5,412,628 | 5/1995 | Yamazaki et al. ........................ | 369/32 |
| 5,425,079 | 6/1995 | Noda et al. ............................... | 379/68 |
| 5,436,875 | 7/1995 | Shinada ..................................... | 369/32 |

FOREIGN PATENT DOCUMENTS

| | | |
|---|---|---|
| 0484912 A2 | 5/1992 | European Pat. Off. . |
| 0487999 A2 | 6/1992 | European Pat. Off. . |
| 3921942 A1 | 1/1991 | Germany . |
| 3138280 A1 | 6/1992 | Germany . |
| 5-46824 | 2/1993 | Japan . |
| 2261132 | 5/1993 | United Kingdom . |
| 2264422 | 8/1993 | United Kingdom . |
| WO 82/03483 | 10/1992 | WIPO . |

OTHER PUBLICATIONS

Patent Abstracts of Japan, vol. 17, No. 354 (P–1567) (5983), Jul. 5, 1993, Information Write–Read System For IC Card, Masaki Ichihara; JP 5–46824 (A).

Database: WPIDS on STN, London, Derwent AN 94–10992 (14), used on Jul. 14, 1997, AB, CA 2101046 A.

Database: WPIDS on STN, London, Derwent AN 94–109921 (14), used on Jul. 14, 1997, AB, CA 2101046 A.

*Primary Examiner*—Ping Lee
*Assistant Examiner*—Patrick N. Edouard
*Attorney, Agent, or Firm*—Frishauf, Holtz, Goodman, Langer & Chick, P.C.

[57] ABSTRACT

A voice recording/reproducing apparatus including a first recording device for recording voice data converted into a digital signal in a solid-state memory. A data read device reads out the voice data which is written in the solid-state memory by the first recording device. A D/A conversion device converts the voice data which is read out from the solid-state memory by the data read device into an analog voice signal. A second recording device records the analog voice signal output from the D/A conversion device on a tape-like recording medium. A reproduction device reproduces the analog voice signal which is recorded on the tape-like recording medium by the second recording device. An output switching device switches between the analog voice signal output by the D/A conversion device and the analog voice signal reproduced by the reproduction device, and outputs a selected one of the analog voice signals.

22 Claims, 10 Drawing Sheets

INFORMATION TRANSFER, RECORDING AND REPRODUCING DEVICE

RELATED APPLICATION

This a Continuation-in-Part of application Ser. No. 08/417,944 filed Apr. 6, 1995 now U.S. Pat. No. 5,610,924.

BACKGROUND OF THE INVENTION

1. Field of the Invention

The present invention relates to a voice information transfer system.

2. Description of the Related Art

As an example of a voice information transfer system for performing voice information transfer between two apparatuses, there is a system for writing/reading voice information in/from an IC card. In this case, a contact terminal is provided to the IC card, and this contact terminal is mechanically connected to a terminal on the information writing/reading apparatus side to electrically exchange a signal, thereby realizing the system. However, when the IC card is repeatedly used in this manner, the contact surface of the contact terminal is worn which tends to cause an information write or read error. For this reason, malfunction of the IC card itself tends to occur, resulting in a degradation in reliability and difficulty in ensuring predetermined durability.

To solve this problem, Jpn. Pat. Appln. KOKAI Publication No. 5-46824 discloses an information write/read system for an IC card, which converts information into an optical signal and transfers the optical signal, thereby writing/reading information without mechanical contact.

To record voice information transferred and stored by this method, a solid-state memory is generally used. However, since the recording capacity of a solid-state memory is smaller than those of other media, the voice information needs to be transferred to a recording medium capable of recording data in a larger quantity. For example, a tape recorder is connected to an external output terminal of the apparatus to transfer voice information stored in a solid-state memory to a magnetic tape.

However, in the system described in the above Jpn. Pat. Appln. KOKAI Publication No. 5-46824, a certain operation by the user is required to start information transfer. Such an operation performed by an unexperienced user may result in an erroneous operation.

In addition, when voice information stored in a solid-state memory is to be transferred to a magnetic tape, troublesome operations including connection are required. Additionally, the sound quality of the recorded voice information is undesirably degraded because of mismatching between the signal level of the external output terminal and that of the input terminal of a tape recorder.

SUMMARY OF THE INVENTION

It is therefore an object of the present invention to provide a voice information transfer system capable of easily performing voice information transfer without any special operation, and at the same time, transmitting the transferred and recorded voice information to another recording medium while maintaining sound quality.

In order to achieve the former portion of the above object, according to the present invention, there is provided a voice information transfer system for transferring voice information in the form of an optical signal from a first voice information processing apparatus to a second voice information processing apparatus, comprising, the first voice information processing apparatus including:
transfer enable signal reception means for receiving a transfer enable signal for enabling transfer of the voice information from the second voice information processing apparatus in a noncontact state, and
voice information transmission means for transmitting the voice information converted into the optical signal to the second voice information processing apparatus when the transfer enable signal reception means receives the transfer enable signal from the second voice information processing apparatus, and the second voice information processing apparatus including:
proximity detecting means for detecting proximity of the first voice information processing apparatus,
transfer enable signal transmission means for transmitting the transfer enable signal to the first voice information processing apparatus when the proximity detecting means detects the proximity, and
voice information reception means for receiving the voice information from the first voice information processing apparatus, which is converted into the optical signal, in a noncontact state.

In order to achieve the latter portion of the above object, according to the present invention, there is provided a voice recording/reproducing apparatus comprising:

first recording means for recording voice data converted into a digital signal in a solid-state memory, data read means for reading out the voice data which is written in the solid-state memory by the first recording means, D/A conversion means for converting the voice data which is read out from the solid-state memory by the data read means into an analog voice signal, second recording means for recording the analog voice signal output from the D/A conversion means on a tape-like recording medium, reproduction means for reproducing the analog voice signal which is recorded on the tape-like recording medium by the second recording means, and output switching means for switching between the analog voice signal from the D/A conversion means and an analog voice signal from the reproduction means and outputting the selected analog voice signal.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE PREFERRED EMBODIMENTS

An embodiment of the present invention will be described below in detail with reference to the accompanying drawings.

Figure 1:
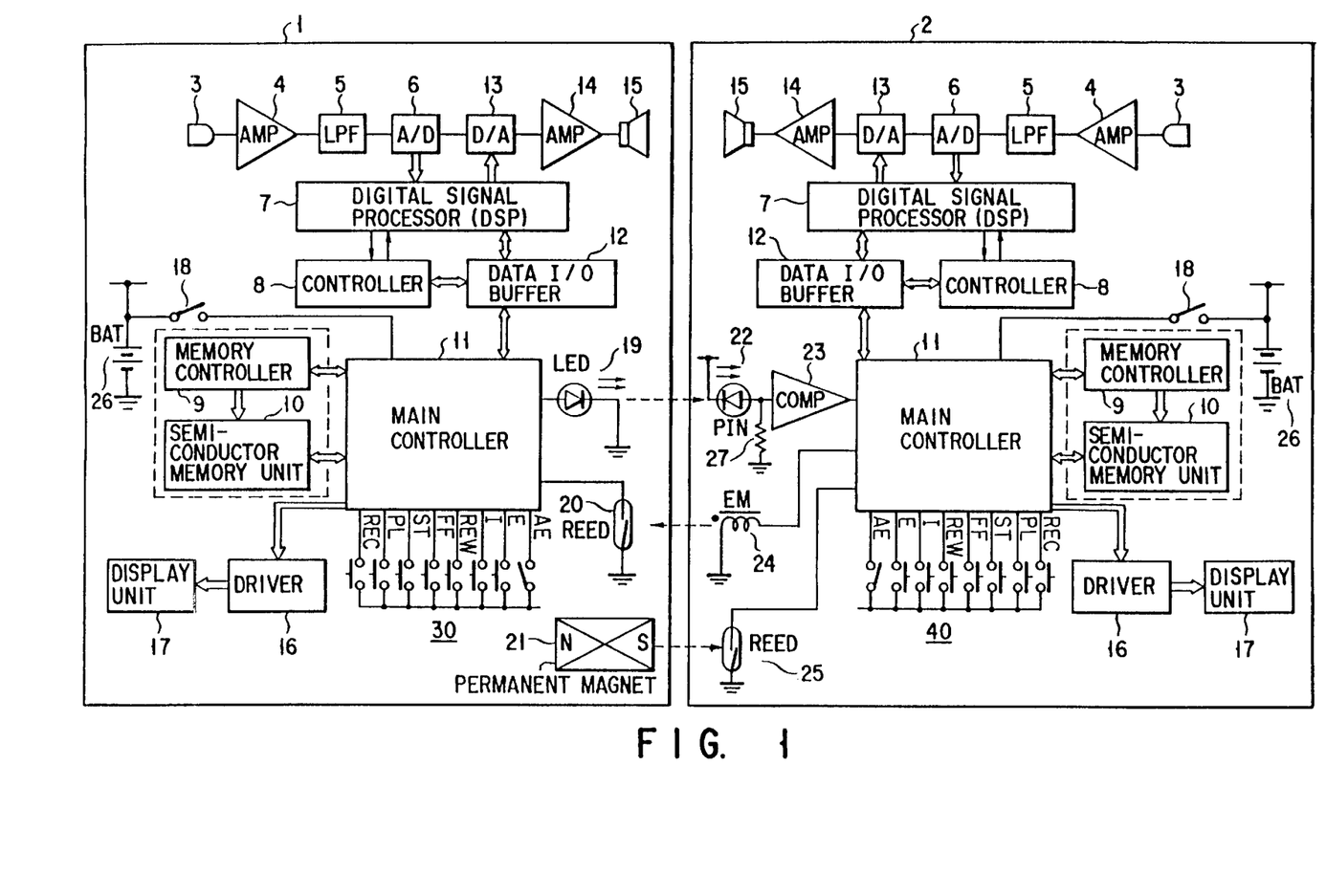
FIG. 1 is a block diagram showing the arrangement of a voice information transfer system according to the first embodiment of the present invention.

FIG. 1 is a block diagram showing the arrangement of a voice information transfer system according to the first embodiment of the present invention, which system is constituted by a portable equipment 1 as the first voice information processing apparatus and a desktop equipment 2 as the second voice information processing apparatus. The portable equipment 1 serves as a portable voice recording/reproducing apparatus for transferring voice information to the desktop equipment 2. The desktop equipment 2 serves as a voice recording/reproducing apparatus used for voice information edition which receives information transmitted from the portable equipment 1.

The arrangement of the portable equipment 1 will be described. Referring to FIG. 1, a microphone 3 is connected to the first terminal of a digital signal processor (DSP) unit 7 having functions as a determination means, a time axis compression means, a detection means, a conditional time axis compression means, and an information processing means through an amplifier (AMP) 4, a low-pass filter (LPF) 5, and an analog-to-digital (A/D) converter 6. The second terminal of the DSP unit 7 is connected to a loudspeaker 15 through a digital-to-analog (D/A) converter 13 and an AMP 14.

The third terminal of the DSP 7 is directly connected to the first terminal of a data input/output (I/O) buffer 12 while the fourth terminal is connected to the second terminal of the data I/O buffer 12 through a controller 8. The third terminal of the data I/O buffer 12 is connected to the first terminal of a main controller 11 having functions as a voice reproduction means, a voice recording means, and an associated information recording means.

The second terminal of the main controller 11 is connected to a battery (BAT) 26 through a main power switch 18. The third terminal is connected to a memory controller 9. The fourth terminal is connected to a semiconductor memory unit 10 as a detachable recording medium. The fifth terminal is connected to a display unit 17 through a driver 16. The sixth terminal is connected to a light-emitting diode (LED) 19 serving as a voice information transmission means for emitting infrared light. The seventh terminal is connected to a reed switch (REED) 20 serving as a transfer enable signal reception means.

The main controller 11 is also connected to a slide operating button 30 for controlling record, stop, play, fast-forward, and fast-rewind processing, which includes a record button REC, a play button PL, a stop button ST, a fast-forward button FF, a fast-rewind button REW, an I (INSTRUCTION) mark button I, an E (END) mark button E, and an automatic erase button AE as an erase selection means.

The portable equipment 1 also has a permanent magnet 21 serving as a proximity signal transmission means. The permanent magnet 21 and the LED 19 constitute a transfer means.

The arrangement of the desktop equipment 2 will be described. Referring to FIG. 1, the microphone 3 is connected to the first terminal of the digital signal processor (DSP) 7 through the amplifier (AMP) 4, the low-pass filter (LPF) 5, and the analog-to-digital (A/D) converter 6. The second terminal of the DSP 7 is connected to the loudspeaker 15 through the digital-to-analog (D/A) converter 13 and the AMP 14.

The third terminal of the DSP 7 is directly connected to the first terminal of the data input/output (I/O) buffer 12 while the fourth terminal is connected to the second terminal of the data I/O buffer 12 through the controller B. The third terminal of the data I/O buffer 12 is connected to the first terminal of the main controller 11.

The second terminal of the main controller 11 is connected to the battery (BAT) 26 through the switch 18. The third terminal is connected to the memory controller 9. The fourth terminal is connected to the semiconductor memory unit 10 as a detachable recording medium. The fifth terminal is connected to the display unit 17 through the driver 16. The sixth terminal is connected to a reed switch (REED) 25 serving as a proximity signal receiving means. The seventh terminal is connected to an electromagnet (EM) 24 serving as a transfer enable signal transmission means. The eighth terminal is connected to the first terminal of a voltage comparator 23. The second terminal of the voltage comparator 23 is connected to a PIN diode (PIN) 22 serving as a voice information reception means, and a resistor 27. The PIN diode 22, the voltage comparator 23, the resistor 27, and the reed switch 25 constitute a reception means.

The main controller 11 is also connected to a slide operating button 40 for controlling record, stop, play, fast-forward, and fast-rewind processing, which includes the record button REC, the play button PL, the stop button ST, the fast-forward button FF, the fast-rewind button REW, the I (INSTRUCTION) mark button I, the E (END) mark button E, and the automatic erase button AE.

The semiconductor memory unit 10 is constituted by a main recording medium unit and a temporary recording medium unit. As the main recording medium unit, a flash memory, a magnetooptical disk, a magnetic disk, a magnetic tape, or the like is used. As the temporary recording medium unit, a memory capable of performing a read/write operation at a relatively high speed as compared to the main recording medium unit, e.g., an SRAM, an EEPROM, a ferroelectric memory, or a flash memory is used. In this embodiment, a flash memory is used as the main recording medium unit, and an SRAM is used as the temporary recording medium unit.

Address information representing the recording position of voice information may be stored in the detachable semiconductor memory unit 10 or a semiconductor memory (internal memory unit; not shown) added to the memory controller 9 in the voice recording/reproducing apparatus.

Figure 2:
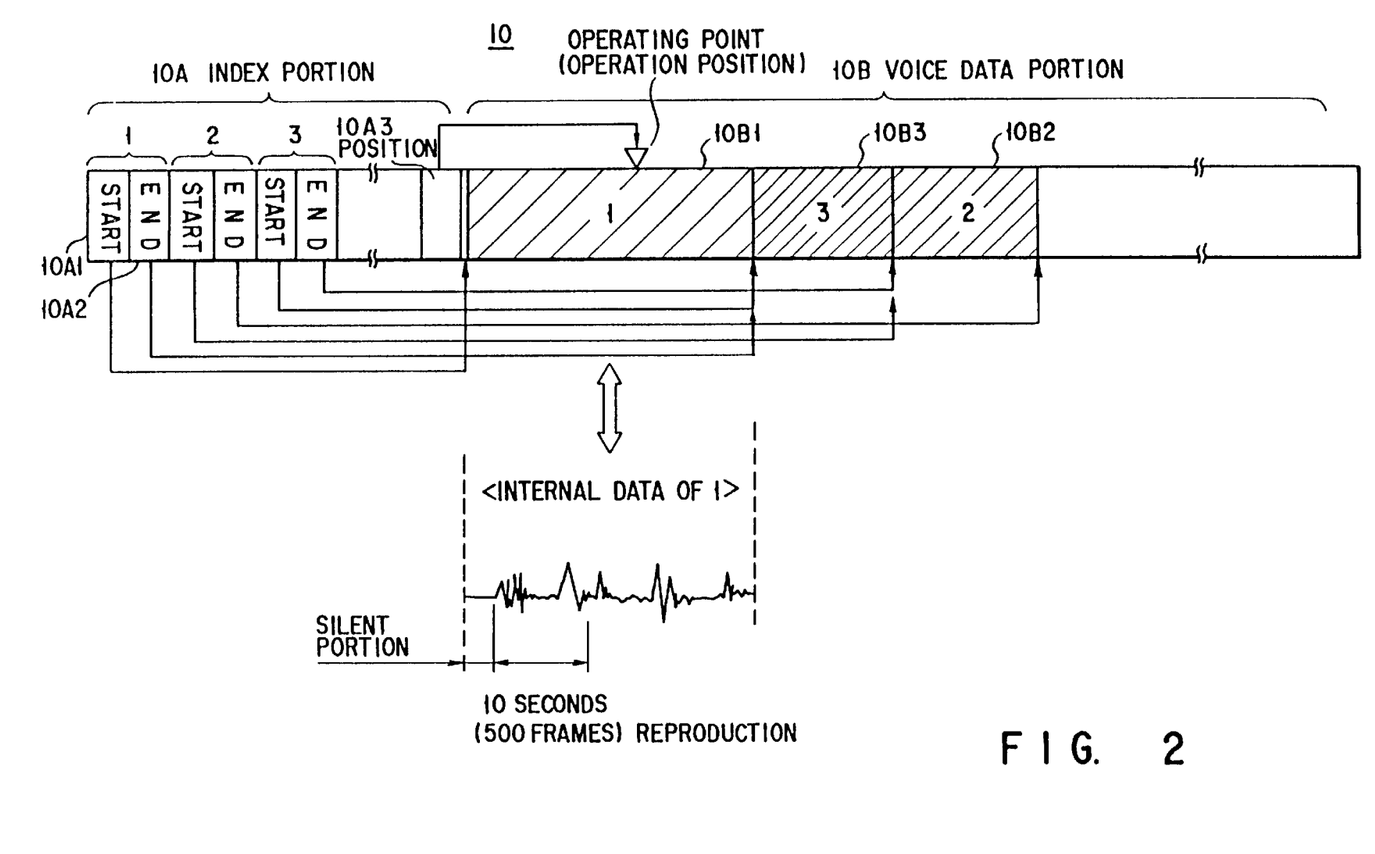
FIG. 2 is a view showing the data recording structure of a semiconductor memory unit.

FIG. 2 is a view showing the recording structure of the semiconductor memory unit 10. As shown in FIG. 2, the memory space is mainly divided into two portions, i.e., an index portion 10A and a voice data portion 10B. The index portion 10A includes operation start position information 10A1 and operation end position information 10A2 for each of a plurality of voice message files 10B1, 10B2, 10B3, . . . ., which are stored in the voice data portion 10B, and other information of code mode, operation conditions, and the like. Operation position information 10A3 representing the operation position in the voice data portion 10B is also recorded in the index portion 10A.

As described above, the automatic erase button AE, the-I mark button I, and the E mark button E are connected to the main controller 11, and these buttons will be described below.

Upon completion of voice information transfer from the portable equipment 1 to the desktop equipment 2, the user turns on or off the automatic erase button AE, thereby selecting whether information in the main recording medium unit of the semiconductor memory unit 10 of the portable equipment 1 is erased.

An I mark is used to designate a priority in a plurality of sentences when the plurality of sentences are to be recorded on a recording medium by an operator, and can be recorded by operating the I mark button I. An E mark is used to indicate punctuation in a plurality of sentences and can be recorded by operating the E mark button E. Therefore, when a typist intends to form a sentence while reproducing the recorded contents, the designated sentences can be formed by referring to the I and E marks.

The overall operation of the portable equipment 1 will be described below, and this operation is common to the desktop equipment 2. In voice recording, an analog voice signal obtained from the microphone 3 is amplified by the AMP 4, and noise is removed by the LPF 5. Thereafter, the analog voice signal is converted into a digital signal by the A/D converter 6 and input to the DSP 7. The DSP 7 compresses the received digital voice signal under the control of the controller 11 and sends the compressed voice signal to the main controller 11 through the data I/O buffer 12.

The main controller 11 controls the operations of the DSP 7, the memory controller 9, and the semiconductor memory unit 10 in accordance with the operations of the plurality of operating buttons and switches. More specifically, an appropriate address signal is supplied to the memory controller 9 in accordance with an operation, and voice information supplied from the data I/O buffer 12 is recorded in the semiconductor memory unit 10.

On the other hand, in voice reproduction, the main controller 11 supplies an appropriate address signal to the memory controller 9, reads out voice information recorded in the semiconductor memory unit 10, and supplies the information to the DSP 7 through the data I/O buffer 12. The DSP 7 expands the voice information. The expanded voice information is converted into an analog signal by the D/A converter 13, amplified by the AMP 14, and thereafter output from the loudspeaker 15 as a voice.

The main controller 11 also controls the driver 16 during voice recording or reproduction, thereby causing the display unit 17 to display various information such as operation mode information.

A transfer operation performed when the user who intends voice information transfer and sets the portable equipment 1 on the desktop equipment 2 will be schematically described below with reference to FIG. 6. The portable equipment 1 shown in FIG. 6 has data edition operating buttons 31 in addition to the slide operating button 30 for controlling record, stop, play, fast-forward, and fast-rewind processing. The display unit 17 and the loudspeaker 15 have already been described above. In addition to the display unit 17 and the operating button 40, the desktop equipment 2 shown in FIG. 6 also has a headphone 41 for listening to reproduced voice information and a foot switch 42 for controlling switching between a play mode, a fast-rewind mode, a stop mode, and the like.

When the portable equipment 1 is set on a portable equipment mounting portion 43 of the desktop equipment 2, the reed switch (REED) 25 of the desktop equipment 2 is turned on by the magnetic force of the permanent magnet 21 of the portable equipment 1. With this operation, the desktop equipment 2 outputs a transmission enable signal for enabling information transmission to the portable equipment 1. For example, the electromagnet (EM) 24 is used as a transmission enable signal output means. The magnetism of the electromagnet (EM) 24 is utilized to turn on the reed switch (REED) 20 serving as a transmission enable signal reception means.

Upon reception of the transmission enable signal, the portable equipment 1 transmits voice information recorded in the semiconductor memory unit 10 by causing the LED 19 connected to the main controller 11 to emit light in accordance with the voice information. At this time, the PIN diode 22 of the desktop equipment 2 receives infrared light from the LED 19 and converts the infrared light into an electrical signal. The electrical signal obtained upon conversion is further converted into an ON/OFF signal and amplified by the voltage comparator 23.

In this manner, voice information recorded by the portable equipment 1 can be optically transferred to the desktop equipment 2 as a reproducing apparatus without connecting any cable.

Figure 6:
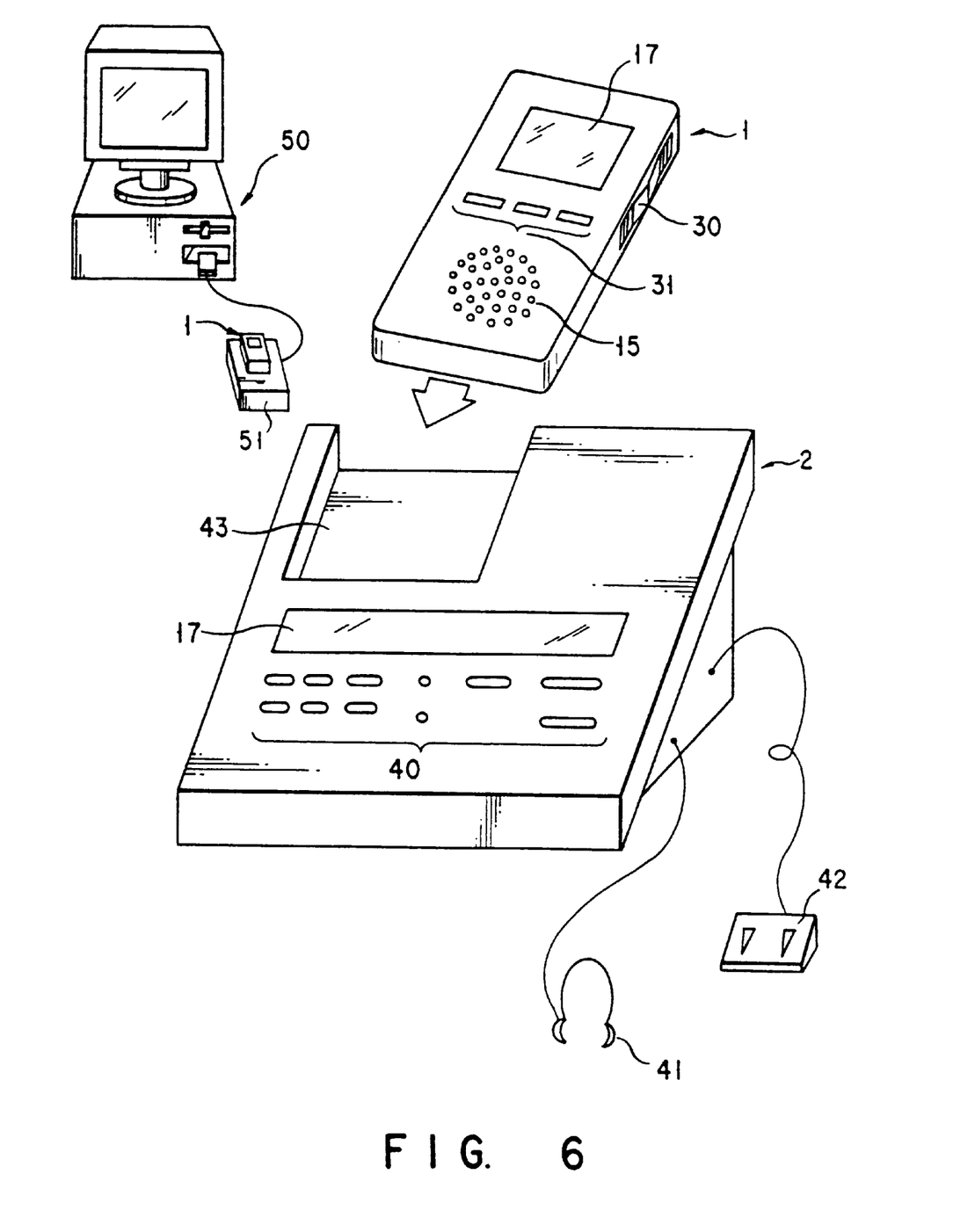
FIG. 6 is a view for explaining an operation of transferring voice information from a portable equipment to a desktop equipment or a personal computer.

In addition, as shown in FIG. 6, voice information recorded by the portable equipment 1 can be optically received by a transfer unit 51. Thereafter, the voice information can be fetched by a personal computer 50 through a PCMCIA card slot and appropriately stored or reproduced.

When voice information is to be transferred through optical communication, data may be automatically transferred upon setting the portable equipment 1 on the desktop equipment 2. Alternatively, data transfer may be started by operating a predetermined operating button after setting.

Figure 3:
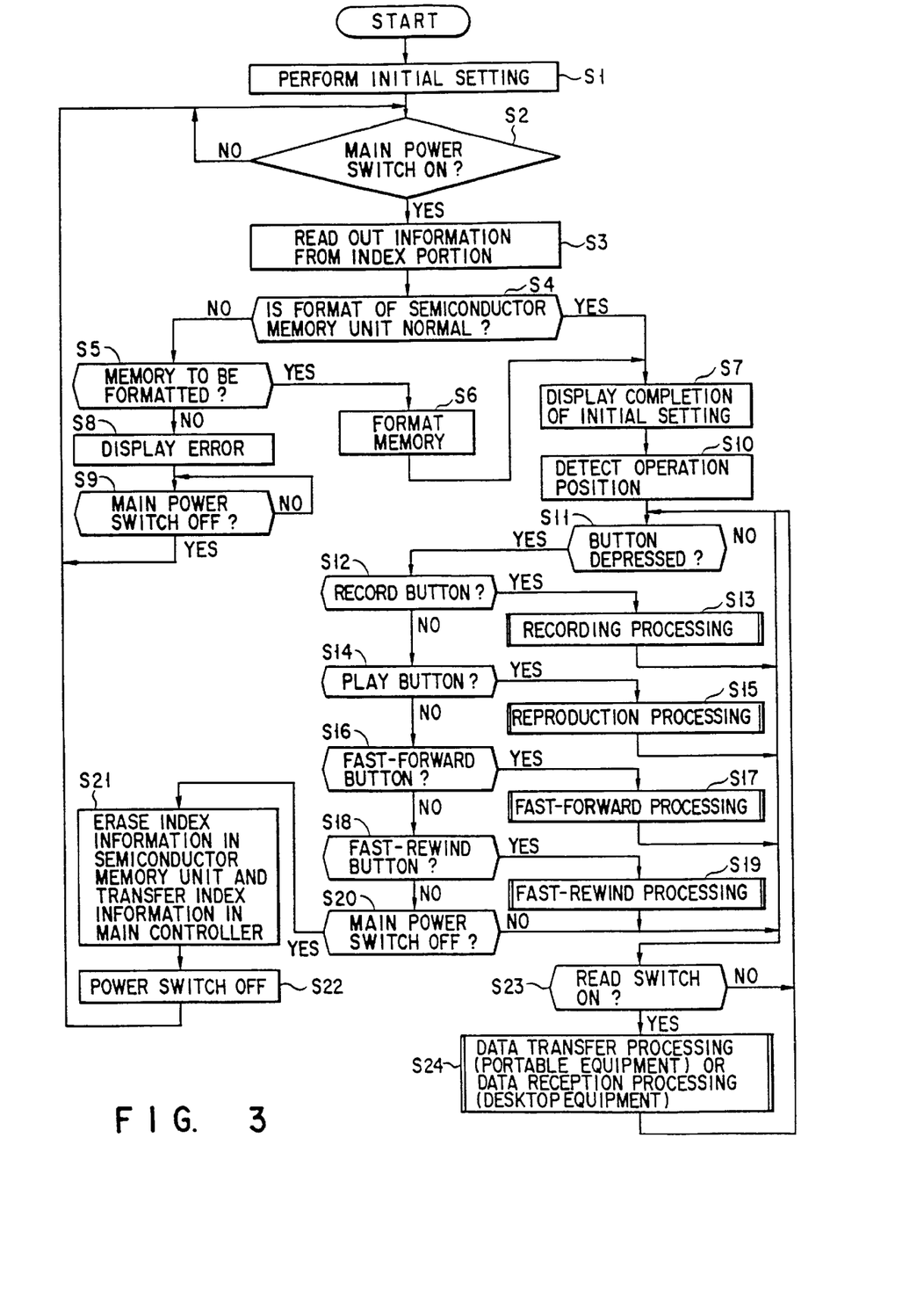
FIG. 3 is a flow chart showing the overall operation of a main controller.

The operation of the main controller 11 which is performed when the battery (BAT) 26 is set in the voice recording/reproducing apparatus, and a power supply voltage is applied thereto will be described below with reference to the flow chart in FIG. 3. This operation is common to the portable equipment 1 and the desktop equipment 2 except for steps S23 and S24. More specifically, upon detecting application of a power supply voltage, the main controller 11 performs initial setting of the external conditions or internal memory units of the main controller 11 (step S1). At this point of time, the main power switch 18 for designating power supply to the entire apparatus is in an OFF state. Upon completion of initial setting, the main controller 11 detects whether the main power switch 18 is turned on (step S2). If YES in step S2, a switch (not shown) arranged between the battery (BAT) 26 and the respective circuits to supply a power to the entire apparatus is turned on. Thereafter, information in the index portion 10A of the semiconductor memory unit 10 is read out (step S3). More specifically, the operation start position information 10A1, the operation end position information 10A2, and other information of a code mode, operation conditions, and the like are read out.

At this time, it is determined on the basis of the information read from the semiconductor memory unit 10 whether an index is already normally recorded in the semiconductor memory unit 10, i.e., whether format (initialization) of the semiconductor memory unit 10 is normal (step S4).

If information out of format is recorded in the semiconductor memory unit 10, the format is determined as abnormal. In this case, it is confirmed whether the memory is to be formatted (step S5). More specifically, the driver 16 is controlled to cause the display unit 17 to display confirmation whether the memory is to be formatted.

If a button (also used as the record button REC) for designating memory format processing is depressed, the semiconductor memory unit 10 is formatted (step S6). More specifically, information representing use conditions is input to the index portion 10A of the semiconductor memory unit 10, and at the same time, "0" is input to the voice data portion 10B. Upon completion of formatting, the driver 16 is controlled to cause the display unit 17 to display completion of initial setting (step S7).

When a button (also used as the stop button ST) for designating not to format the memory is depressed, the driver 16 is controlled to cause the display unit 17 to perform error display indicating that the semiconductor memory unit 10 is not normal (step S8) and also to display a prompt to exchange the semiconductor memory unit 10. Simultaneously, the switch (not shown) arranged between the battery (BAT) 26 and the respective circuits to supply a power to the entire apparatus is turned off. Thereafter, to exchange the semiconductor memory unit 10, processing waits until the main power switch 18 is turned off (step S9). Upon detecting the OFF state of the main power switch 18, the flow returns to step S2.

On the other hand, when initial setting of the semiconductor memory unit 10 is normally performed, completion of initial setting is displayed (step S7). Thereafter, a current operation position is detected from the information (operation position information 10A3) read from the index portion 10A, and the driver 16 is controlled to cause the display unit 17 to display the detected position (step S10). While detecting whether any operating button of the apparatus is depressed, each circuit is set in a wait state (step S11). If no operating button is depressed, it is detected whether the reed switch (REED) 20 of the portable equipment 1 or the reed switch (REED) 25 of the desktop equipment 2 is in an ON state (step S23). If YES in step S23, the flow advances to step S24. If the reed switch 20 of the portable equipment 1 is in an ON state, data transfer processing is performed. If the reed switch 25 of the desktop equipment 2 is in an ON state, processing is shifted to data reception is processing.

If YES in step S11, it is detected first whether the operated button is the record button REC (step S12).

If YES in step S12, the DSP 7 is controlled to compress voice information received from the A/D converter 4, and the memory controller 9 is controlled to perform recording processing for recording the voice information in the voice data portion 10B of the semiconductor memory unit 10 (step S13).

If NO in step S12, detection of the play button PL is performed (step S14). If YES in step S14, the memory controller 9 is controlled to read out recorded data from the voice data portion 10B of the semiconductor memory unit 10. The readout data is sent to the DSP 7 for expansion processing, and reproduction processing is started to send the voice information to the D/A converter 13 (step S15).

If the play button PL is not depressed, it is determined whether the fast-forward button FF is depressed (step S16). If YES in step S16, fast-forward processing is started to perform a fast-forward operation at an appropriate speed (e.g., 20 times that in reproduction), thereby sequentially moving the operation position (step S17).

If NO in step S16, it is determined whether the fast-rewind button REW is depressed (step S18). If YES in step S18, fast-forward processing is started to move the operation position in an opposite direction at the same speed as in the above fast-forward operation (step S19).

The processing in step S13, S15, S17, or S19 ends when the stop button ST is depressed, and the flow returns to step S11.

If a button other than the record, play, fast-forward, and fast-rewind buttons is operated, it is detected whether the power switch 18 is turned off, and the states of various setting buttons are detected (step S20). If YES in step S20, the memory controller 9 is controlled to erase index information in the index portion 10A of the semiconductor memory unit 10 and transfer index information stored in a memory unit (not shown) in the main controller 11 to the index portion 10A of the semiconductor memory unit 10 (step S21). Upon completion of index information transfer processing, the power switch (not shown) for supplying a power to the entire apparatus is turned off (step S22). The flow returns to step S2.

If NO in step S20, the states of various setting buttons are detected and stored in the internal memory unit, and the flow returns to step S31. The setting buttons are not actually provided to the apparatus. They are realized by simultaneously depressing some of the record button REC, the play button PL, the stop button ST, the fast-forward button FF, the fast-rewind button REW, the I mark button I, the E mark button E, and the automatic erase button AE.

Figure 4:
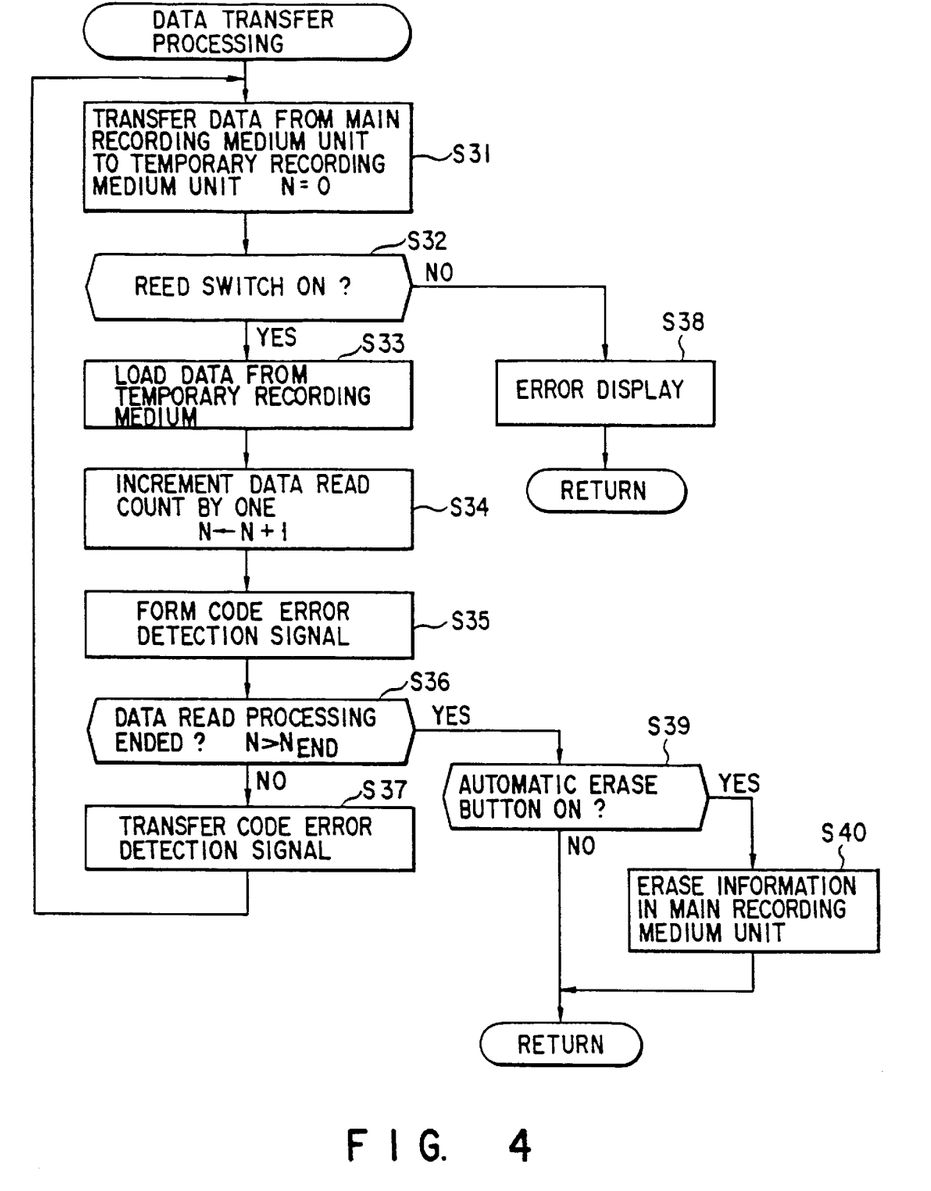
FIG. 4 is a flow chart for explaining the detailed operation of data transfer processing in the flow chart of FIG. 3.

Data transfer processing of the portable equipment 1 in the above step S24 will be described below in more detail with reference to the flow chart in FIG. 4.

The main controller 11 controls the memory controller 9 to transfer data from the main recording medium unit of the semiconductor memory unit 10 to the temporary recording medium unit (step S31) and set "0" to a counter N (to be referred to as a process data read count N hereinafter) for managing the process data read count. It is detected whether the reed switch 20 is in an ON state (step S32). If YES in step S32, the reception side (desktop equipment 2) detects during data transfer whether the data is normally transferred from the main recording medium unit of the semiconductor memory unit 10 to the temporary recording medium unit. In accordance with the detection result, the electromagnet 24 is controlled to turn on/off the reed switch 20 on the data transmission side, thereby informing the transmission side whether data transfer is normally performed. If the reed switch is in an ON state, it is determined that data transfer is normally performed, and the flow advances to step S33. If the reed switch is in an OFF state, error display is made to indicate that transfer is not normally performed (step S38), and the data transfer processing routine is ended.

In step S33, the main controller 11 reads out data from the temporary recording medium unit of the semiconductor memory unit 10 (step S33). The LED 19 is caused to emit light to transfer the data, and at the same time, the process data read count N is incremented by one (step S34). Subsequently, a code error detection signal is formed (step S35). As the code error detection signal, a detection method by a parity check, a CRCC (cyclic code), or a Viterbi code is used. In this embodiment, a CRCC is used. It is then determined whether data read processing is ended, i.e., whether the process data read count N is larger than an end read count $N_{END}$ (step S36). If NO in step S36, it is determined whether the automatic erase button AE is depressed by the user (step S39). If YES in step S39, information in the main recording medium unit of the semiconductor memory unit 10 of the portable equipment 1 is erased (step S40), and the processing is ended. If NO in step S39, the processing is ended. If data read processing is not ended in step S36, a code error detection signal is transferred (step S37), and the flow returns to step S31.

As described above, the user can select whether information in the main recording medium unit of the semiconductor memory unit 10 of the portable equipment 1 is erased by turning on or off the automatic erase button AE upon completion of data transfer processing. More specifically, when the automatic erase button AE is turned on, information in the main recording medium unit is erased, thereby enabling recording by the portable equipment 1 again. If the automatic erase button AE is held in an OFF state, information in the main recording medium unit can be reproduced and listened to.

Figure 5:
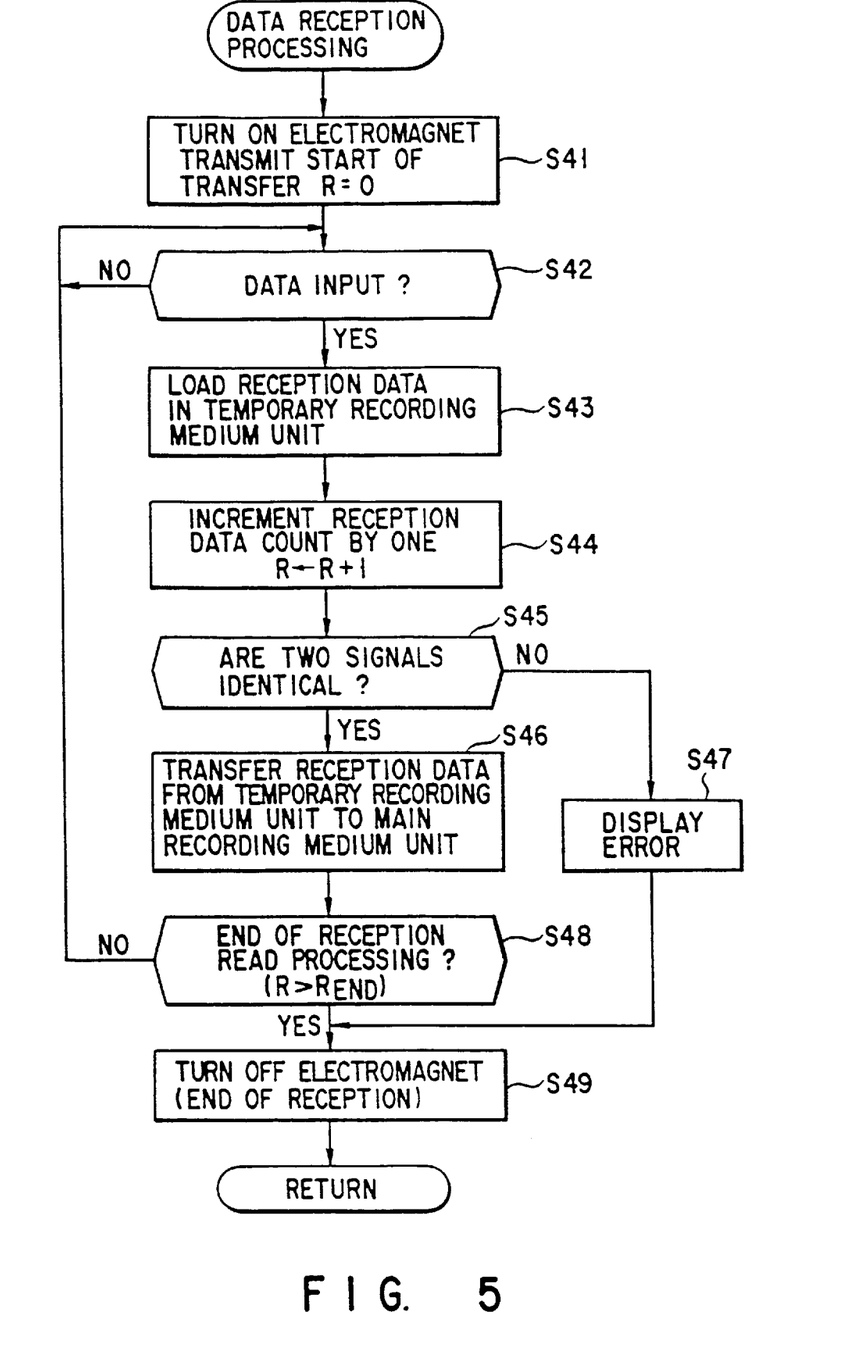
FIG. 5 is a flow chart for explaining the detailed operation of data reception processing in the flow chart of FIG. 3.

Data reception processing of the desktop equipment 2 in the above step S24 will be described below in more detail with reference to the flow chart in FIG. 5.

The electromagnet (EM) 24 is turned on to permit the data transmission side to start transfer of data (step S41), and at the same time, a counter R (to be referred to as a reception data count R hereinafter) for managing the reception data count is incremented. Processing waits until next data is received (step S42). If data is received, the data is loaded to the temporary recording medium unit of the semiconductor memory unit 10 (step S43), and the reception data count R is incremented by one (step S44). A code error detection signal formed on the reception side in advance is compared with a received code error detection signal, thereby determining whether the two signals are identical (step S45). If NO in step S45, it is determined that data transfer is not normally performed, and error display is made to indicate a transfer abnormality (step S47). The electromagnet (EM) 24 is turned off (step S49) to notify the transfer abnormality to the data transfer side, thereby ending the data reception processing routine.

If YES in step S45, the received data is transferred from the temporary recording medium unit of the semiconductor memory unit 10 to the main recording medium unit (step S46). It is determined whether reception read processing is ended, i.e., whether the reception data read count R is larger than a reception end number $R_{END}$ (step S48). If YES in step S48, it is determined that reception read processing is ended, and the flow advances to step S49 to turn off the electromagnet 24, thereby ending the data reception processing routine. If NO in step S48, i.e., if the reception data read count R is smaller than the reception end number $R_{END}$, and it is determined that reception read processing is not ended, the flow returns to step S42 to wait data input.

In the first embodiment, the electromagnet 24 is used as a transmission enable signal output means, and the reed switch (REED) 20 is used as a transmission enable signal reception means. However, the present invention is not limited to those. For example, a magnetic head or a Hall element may be used as a transmission enable signal output means. Alternatively, a solenoid may be driven to convert an output into a dynamic means, this dynamic means may be used as a transmission enable signal, and a microswitch may be used as a transmission enable signal reception means. An LED or a laser emitting diode using light or an infrared ray, or an optical shutter using an LCD may be used as a transmission enable signal output means, and an element such as a PIN diode or a phototransistor for converting light into an electrical signal may be used as a transmission enable signal reception means. An oscillator and an antenna may be used as a transmission enable signal output means to transmit a radio wave or a microwave, and an antenna may be used as a transmission enable signal reception means to supply a received signal to a low-pass filter or the like for demodulation. A loudspeaker may be used as a transmission enable signal output means to transfer a specific sound or ultrasonic wave as a transmission enable signal, and a microphone may be used as a transmission enable signal reception means to receive the specific sound or ultrasonic wave.

In the first embodiment, transfer of voice information has been described. However, the present invention is not limited to this and can also be applied to transfer information including image information and character information.

According to the first embodiment, data transfer is automatically performed only by setting the portable equipment 1 as a source on the desktop equipment 2 as a destination. For this reason, voice information transfer can be easily performed without any special operation.

Upon completion of data transfer from the portable equipment 1 to the desktop equipment 2, data in the semiconductor memory unit 10 of the portable equipment 1 is automatically erased. Therefore, the user can immediately start recording by the portable equipment 1.

With the automatic erase button AE, when data transfer from the portable equipment 1 to the desktop equipment 2 is completed, the user can select a mode for reproducing and listening to information stored in the semiconductor memory unit 10 of the portable equipment or a mode for erasing the information and recording new information.

The second embodiment of the present invention will be described below with reference to the accompanying drawings.

Figure 7:
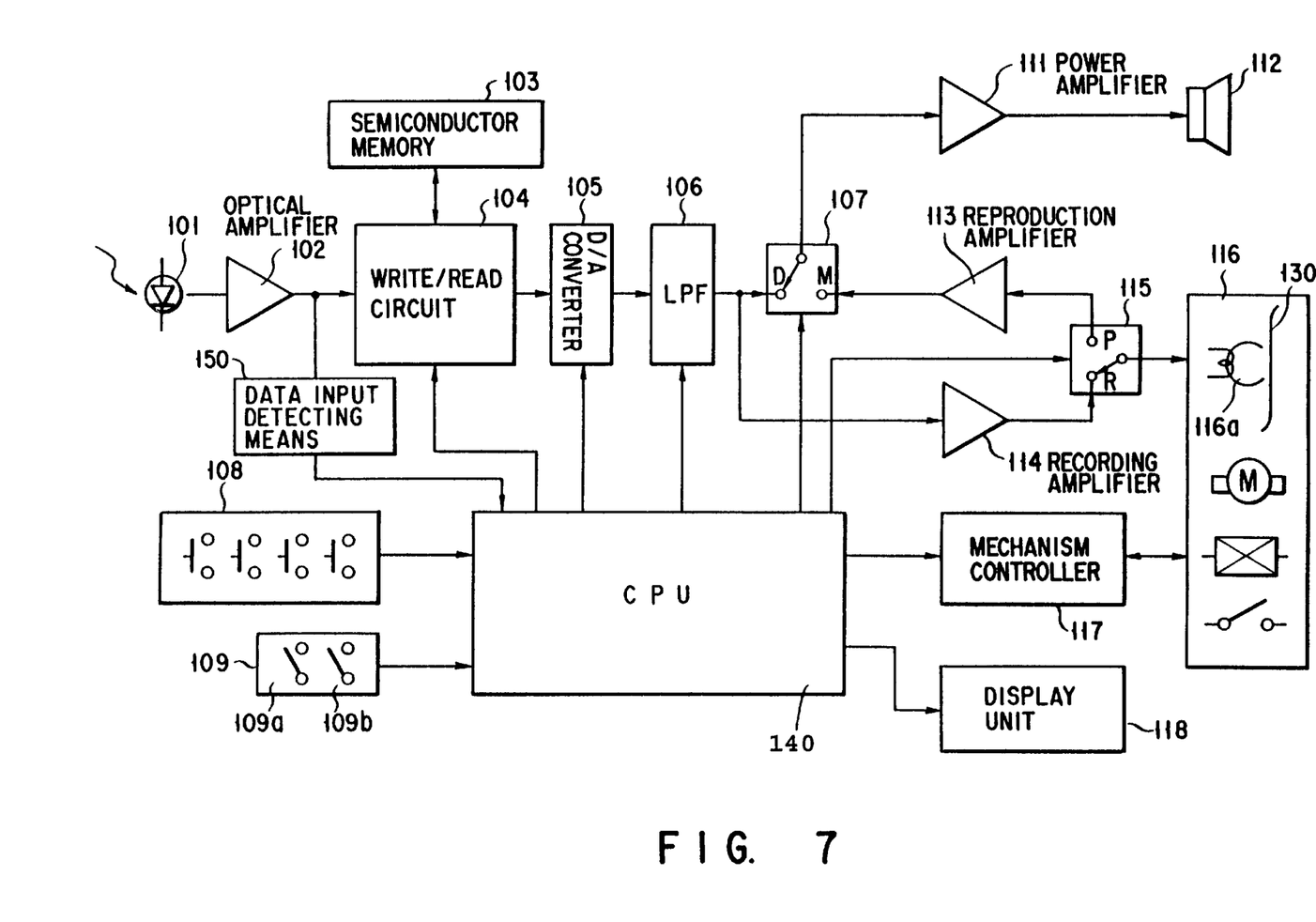
FIG. 7 is a block diagram showing the arrangement of a desktop equipment according to the second embodiment of the present invention.

FIG. 7 is a block diagram showing the arrangement of a voice recording/reproducing apparatus as a desktop equipment to which the second embodiment of the present invention is applied. Referring to FIG. 7, a photodiode 101 serving as a reception unit for receiving an optical signal as a digital voice signal is connected to a write/read circuit 104 serving as both a data write means and a data read means through an optical amplifier 102. The write/read circuit 104 is connected to a semiconductor memory 103 as a solid-state memory and also connected to one stationary terminal D of a digital/MC switching circuit (to be referred to as a D/M switching circuit hereinafter) 107 through a D/A converter 105 serving as a D/A conversion means and an LPF (low-pass filter) 106. A loudspeaker 112 is connected to the movable terminal of the D/M switching circuit 107 through a power amplifier 111. On the other hand, the other stationary terminal M of the D/M switching circuit 107 is connected to one stationary terminal P of an MC copy switching circuit 115 through a reproduction amplifier 113 for amplifying a voice signal reproduced from a magnetic tape 130 incorporated in a compact cassette called a microcassette. The other stationary terminal R of the MC copy switching circuit 115 is connected to the output terminal of the LPF 106 through a recording amplifier 114. The moving terminal of the MC copy switching circuit 115 is connected to a magnetic head 116a constituting an MC mechanism (tape driving mechanism) 116. The MC mechanism 116 has constituent elements including a motor, a solenoid, and a switch, all of which are necessary for driving the magnetic tape 130. These elements are controlled through a connected mechanism controller 117.

An operating button 108 and a switch 109, which can set various modes, are connected to a CPU 140 serving as a control unit. The switch 109 includes a copy switch 109a and a D/M change-over switch 109b. The CPU 140 is also connected to the write/read circuit 104, the D/A converter 105, the LPF 106, the D/M switching circuit 107, the MC copy switching circuit 115, the mechanism controller 117, and a display unit 118, all of which are controlled in accordance with control signals from the CPU 140. The CPU 140 is still further connected to data input detecting means 150, which detects externally input voice data. When the data input detecting means 150 detects externally input voice data, the CPU 140 automatically activates write/read circuit 104 to write the voice data in semiconductor memory 103.

Figure 8:
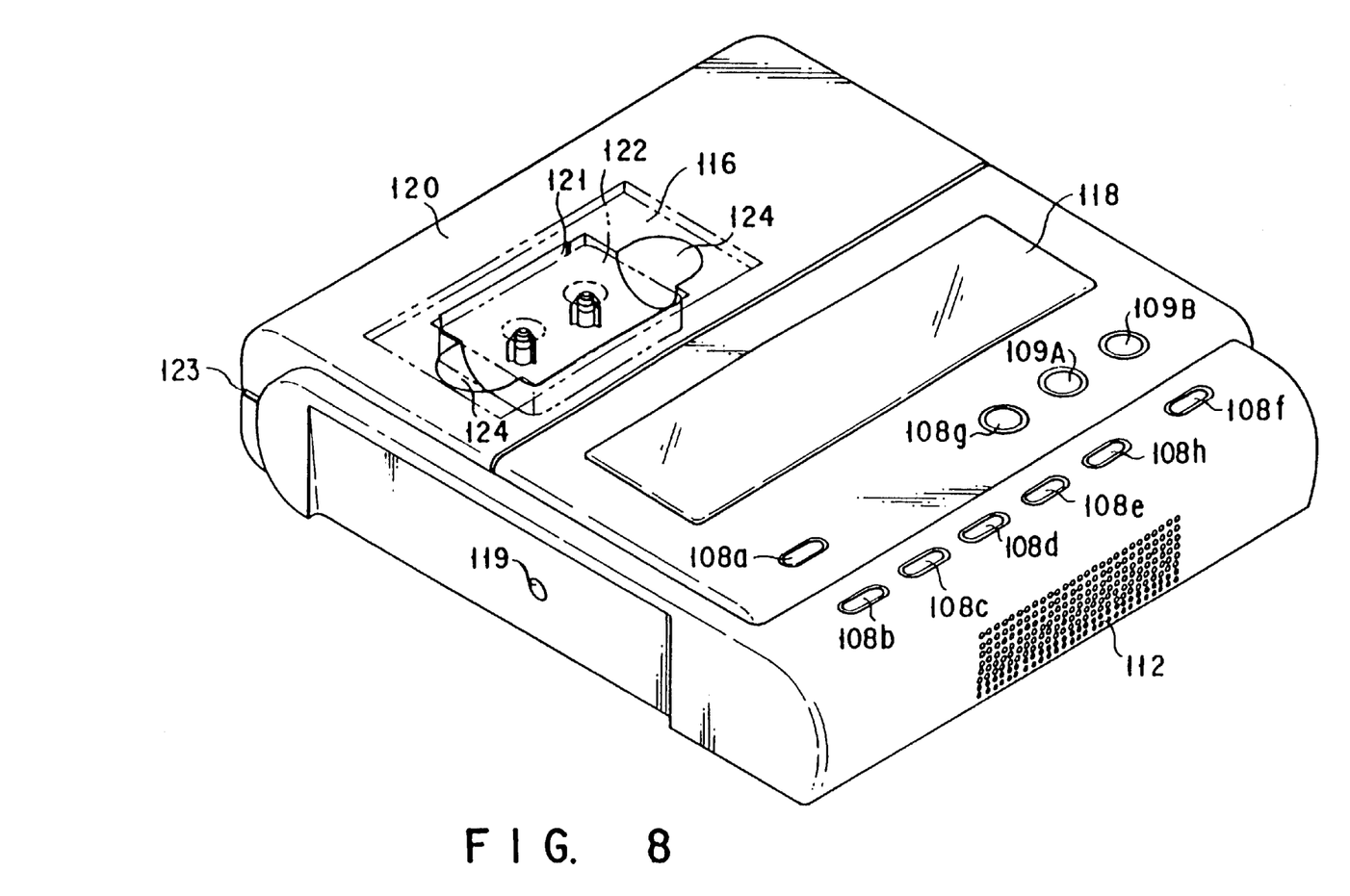
FIG. 8 is a perspective view showing the outer appearance of the desktop equipment shown in FIG. 7.

FIG. 8 is a perspective view showing the outer appearance of the voice recording/reproducing apparatus according to the second embodiment of the present invention. The same reference numerals as in FIG. 7 denote the same elements in FIG. 8.

A hinge portion 123 is provided to the rear surface portion of the apparatus. An opening/closing lid 120 is attached to freely pivot about the hinge portion 123 to be opened. A tape driving mechanism 116 for mounting and driving a microcassette 122 is arranged in the main body under the opening/closing lid 120. In mounting the microcassette 122, the user inserts a thumb and a pointing finger into finger insertion portions 124, thereby loading or removing the microcassette 122 held by the fingers.

The upper surface portion has the display unit 118 such as a liquid crystal display, a power button 108a, a fast-rewind button 108b, a play button 108c, a fast-forward button 108d, an erase button 108e, a search button 108f, a data transfer button 108g, a stop button 108h, a dubbing button 109A, and a D/M switching button 109B. The D/M switching button 109B is used for selecting whether the operating button 108 including the fast-rewind button 108b, play button 108c, fast-forward button 108d, erase button 108e, search button 108f, and stop button 108h is used for the semiconductor memory 103 or the microcassette 122. The loudspeaker 112 is arranged on the front side surface portion. An optical data reception window 119 for receiving optical data from, e.g., the portable equipment 1 of the first embodiment is provided on the left side surface portion. In optical data transfer processing, a portable equipment 1 is attached to the left side surface portion, and data is transferred from the optical data transmission window on the lower surface of the portable equipment 1 as shown in FIG. 6.

The function of the voice recording/reproducing apparatus according to the second embodiment will be described below.

When voice data is to be recorded from a compact recorder such as the portable equipment 1 to the semiconductor memory 103 through optical communication, the power button 108a is turned on. Thereafter, the data transfer button 108g is also turned on. A digital optical voice signal output from the portable equipment 1 in accordance with a command from the CPU 110 is received by the photodiode 101 through the optical data reception window 119 and amplified by the optical amplifier 102. The voice data is written in the semiconductor memory 103 by the write/read circuit 104.

In the actual optical communication, first of all, data representing a to-be-transmitted voice data amount is sent from the portable equipment 1, and subsequently, voice data is transmitted.

When transmission starts, predetermined bar display is made by the display unit 118. Defining a to-be-sent data amount as 100%, the length of a bar sequentially increases as the data is sent. For example, when 30% of data is sent, a bar having a length corresponding to 30% of an entire bar is displayed. The data transfer speed in optical communication is several times higher than that in communication performed through a connection code between the portable equipment 1 and the apparatus of this embodiment.

Figure 9:
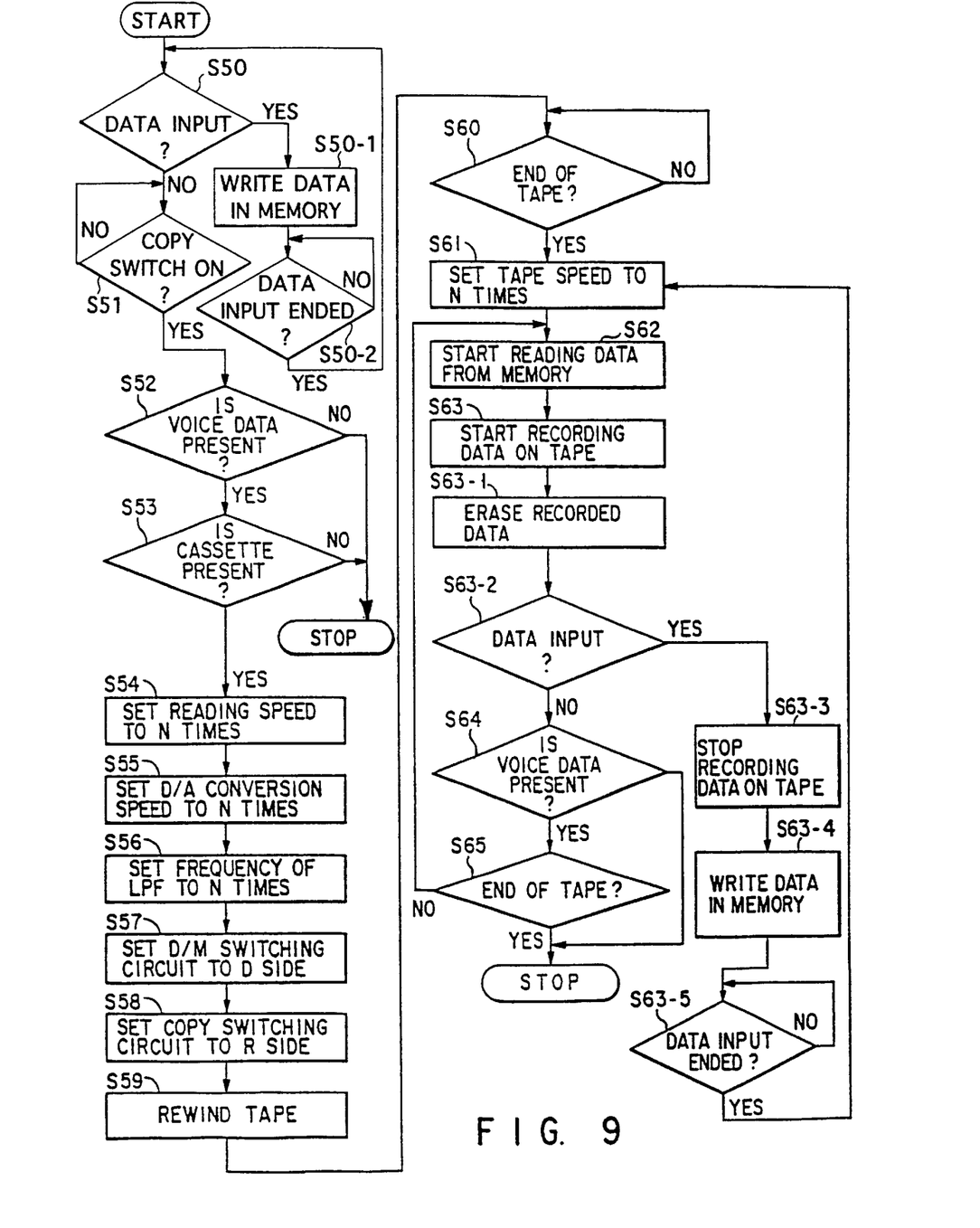
FIG. 9 is a flow chart for explaining the dubbing operation of the desktop equipment according to the second embodiment.

The dubbing operation of this embodiment will be described below with reference to FIG. 9.

In step S50, when the data input detecting means 150 detects an externally input voice data (i.e., YES in step S50), the CPU 140 automatically activates write/read circuit 104 to write the voice data in semiconductor memory 103 (step S50-1). In step S50-2 it is checked to see if data input has ended. If NO in step S50-2, it is again (repeatedly) checked if data input has ended. If YES in step S50-2, control proceeds to step S50. At this point, if NO in step S50, in a power ON state, the dubbing button 109A is operated to copy the recorded contents in the semiconductor memory 103 to the magnetic tape 130. The CPU 140 determines whether the copy switch 109a is in an ON state (step S51). If YES in step S51, it is determined whether voice data is present in the semiconductor memory 103 (step S52). If NO in step S52, the operation is stopped.

If YES in step S52, it is determined whether a cassette is mounted in the tape driving mechanism 116 (step S53). If NO in step S53, the operation is stopped. Otherwise, the reading speed of the write/read circuit 104 is set to N times the normal speed (step S54). Subsequently, the D/A conversion speed of the D/A converter 105 is set to N times (step S55). In addition, the frequency of the LPF 106 is set to N times, and the D/M switching circuit 107 is set to the D side. The copy switching circuit 115 is set to the R side, and the magnetic tape 130 is rewound (step S59). It is determined whether the tape 130 is rewound to its end, i.e., the start position. If it is determined that the tape 130 is rewound to the start end, the tape speed is set to N times (step S61). Subsequently, voice data reading from the semiconductor memory 103 is started (step S62), and at the same time, data recording in the magnetic tape 130 is also started (step S63). As voice data is recorded in the magnetic tape 130, the voice data is sequentially erased from the semiconductor memory 103 (step S63-1). The data input detecting means detects whether voice data is being externally input (step S63-2). If YES in step S63-2, data recording in the magnetic tape 130 is stopped (step S63-3) and the CPU 140 automatically activates write/read circuit 104 to write the externally input voice data in semiconductor memory 103 (step S63-4). When data input is ended, the tape speed is again set to N times (S63-5). If NO in step S63-2, it is determined whether voice data is left in the semiconductor memory 103 (step S64). If YES in step S64, it is determined whether the magnetic tape 130 is fed to its end, i.e., the terminal end (step S65). When the voice data in the semiconductor memory 103 is completely read out (step S64), or when the tape 130 is fed to its end position (step S65), the processing is ended.

Figure 10:
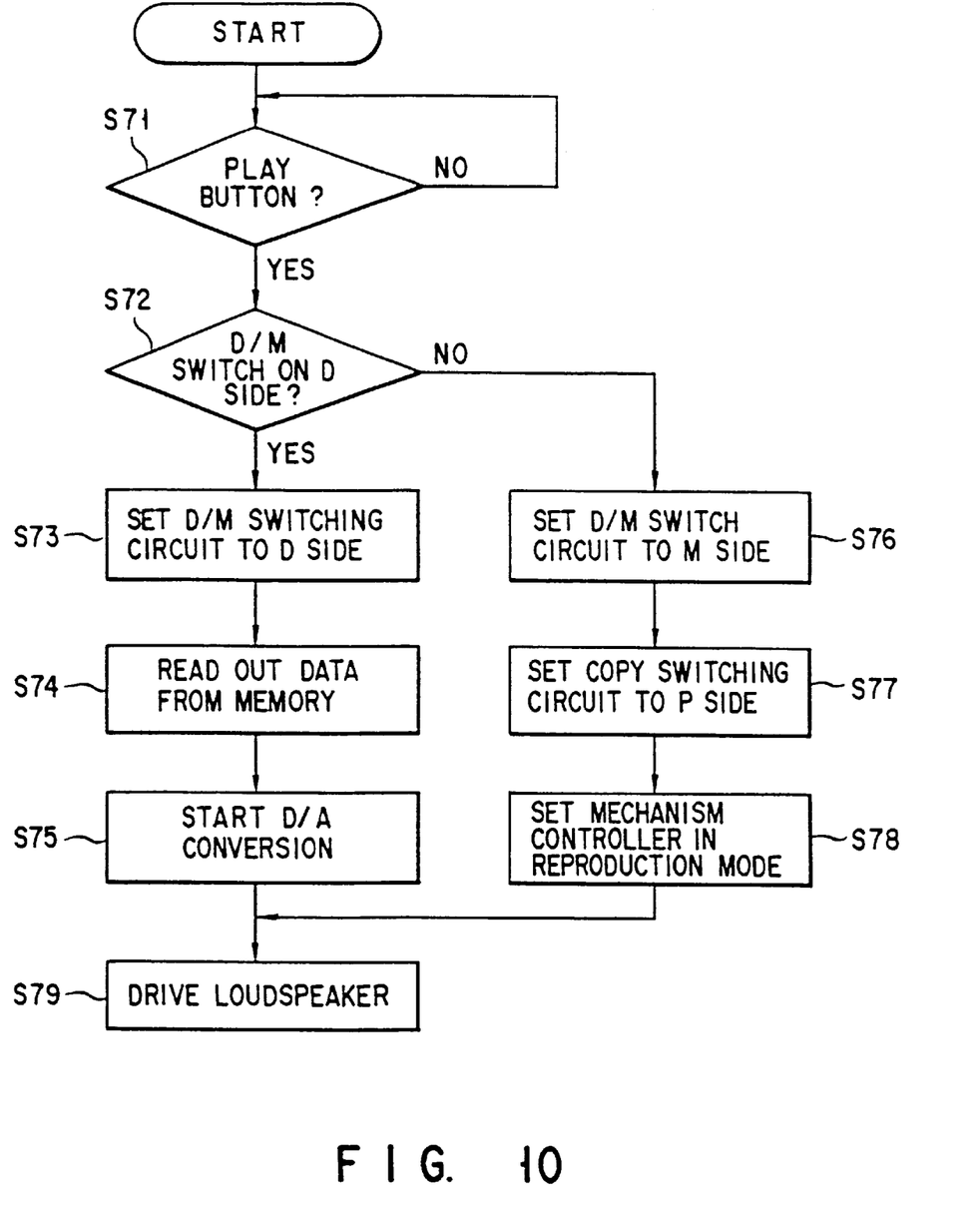
FIG. 10 is a flow chart for explaining the reproduction operation of the desktop equipment according to the second embodiment.

The reproduction operation of this embodiment will be described below with reference to FIG. 10.

When the play button 108c is operated to set a reproduction mode, the CPU 140 determines whether the play button 108c is operated (step S71). If YES in step S71, it is determined whether the D/M change-over switch 109b is set to the D side (step S72). If YES in step S72, the D/M switching circuit 107 is set to the D side (step S73), voice data is read out from the semiconductor memory 103 (step S74), and D/A conversion is subsequently started (step S75). The obtained analog signal is supplied through the LPF 106 and the power amplifier 111, thereby driving the loudspeaker 112 (step S79). On the other hand, if the D/M change-over switch 109b is set not to the D side but to the M side, the D/M switching circuit 107 is set to the M side (step S76). The copy switching circuit 115 is set to the P side to set the tape driving mechanism 116 in a reproduction mode. A signal detected by the magnetic head 116a is supplied through the reproduction amplifier 113 and the power amplifier 111, thereby driving the loudspeaker 112.

In this manner, in accordance with the state of the D/M change-over switch 109b (D/M switching button 109B), voice data recorded in the semiconductor memory 103 or the magnetic tape 130 of the microcassette 122 can be subjected to predetermined processing according to the operation mode of the operating button 108 including the fast-rewind button 108b, play button 108c, fast-forward button 108d, erase button 108e, search button 108f, and stop button 108h.

As described above, according to the voice recording/reproducing apparatus of the second embodiment, voice data in the semiconductor memory can be copied easily to a tape-like recording medium with a high sound quality. With the above arrangement, the copied voice data can be reproduced and listened to through the loudspeaker, as well as the voice data read from the semiconductor memory 103 can be directly reproduced and listened to from the loudspeaker after D/A conversion, thereby efficiently performing a document creation operation.

According to the second embodiment of the present invention, voice data in a solid-state memory can be easily copied to a tape-like recording medium with a high sound quality.

Additional advantages and modifications will readily occur to those skilled in the art. Therefore, the invention in its broader aspects is not limited to the specific details, and representative devices shown and described herein. Accordingly, various modifications may be made without departing from the spirit or scope of the general inventive concept as defined by the appended claims and their equivalents.

What is claimed is:

1. A voice recording/reproducing apparatus comprising:
    a digital voice signal receiver for receiving digital voice signals corresponding to voice data sent from a portable digital voice recorder;
    first recording means for recording voice data in a solid-state memory;
    data read means for reading out the voice data which is written in said solid-state memory by said first recording means;
    D/A conversion means for converting the voice data which is read out from said solid-state memory by said data read means into an analog voice signal;
    second recording means for recording the analog voice signal output from said D/A conversion means on a recording medium;
    reproduction means for reproducing the analog voice signal which is recorded on said recording medium by said second recording means;
    output switching means for switching between the analog voice signal output by said D/A conversion means and the analog voice signal reproduced by said reproduction means, and for outputting a selected one of the analog voice signals;
    voice data input detecting means for detecting externally-input voice data; and
    interrupt means for interrupting a recording operation of said second recording means when said voice data input detecting means detects externally-input voice data during the recording operation of said second recording means;
    wherein a recording operation of said first recording means is automatically activated when said voice data input detecting means detects externally-input voice data during the recording operation of said second recording means.

2. An apparatus according to claim 1, further comprising a first operating member for processing the analog voice signal, a second operating member for processing the analog voice signal recorded on said recording medium, at least a portion of said first and second operating members having a common operating member, and function selection means for selecting whether said common operating member operates in connection with said first operating member or said second operating member.

3. An apparatus according to claim 1, further comprising speed change means for increasing a reading speed at which said data read means reads out the voice data from said solid-state memory and a running speed at which said reproduction means reproduces the analog voice signal recorded on said recording medium, said increased reading and running speeds being increased as compared to a normal voice reproduction operation when the voice data recorded in said solid-state memory is recorded on said recording medium.

4. An apparatus according to claim 1, further comprising detecting means for detecting whether or not voice data is recorded in said solid-state memory when said second recording means is to perform a recording operation, and stopping means for stopping the recording operation of the second recording means when said detecting means detects that no voice data is recorded in said solid-state memory.

5. An apparatus according to claim 1, further comprising sequential erasing means for sequentially erasing recorded data from said solid-state memory when a recording operation of said second recording means is being performed.

6. An apparatus according to claim 1, further comprising:
    receiving means for receiving voice data which has been converted into digital signals; and
    display means for displaying a quantity of voice data received by said receiving means;
    said first recording means recording received voice data in said solid-state memory.

7. An apparatus according to claim 1, further comprising:
    proximity signal reception means for receiving the proximity signal transmitted from another voice information processing apparatus;
    transfer enable signal transmission means for transmitting the transfer enable signal to said another voice information processing apparatus when said proximity signal reception means receives the proximity signal; and voice information reception means for receiving the voice information from said another voice information processing apparatus, which is converted into the optical signal, in a noncontact state.

8. An apparatus according to claim 1, wherein the recording medium comprises a magnetic tape.

9. An apparatus according to claim 1, wherein said portable digital voice recorder is set on a recorder mount portion.

10. An apparatus according to claim 1, further comprising a foot-actuated switch which enables selection of a play mode, a fast-rewind mode or a stop mode.

11. An apparatus according to claim 1, wherein the externally-input voice data detected by said voice data input detecting means is digital externally-input voice data.

12. A voice recording/reproducing apparatus comprising:

a digital voice signal receiver for receiving digital voice signals corresponding to voice data sent from a portable digital voice recorder;

a first recorder which records voice data in a solid-state memory;

a data reader which reads out the voice data which is written in said solid-state memory by said first recorder;

a D/A converter which converts the voice data which is read out from said solid-state memory by said data reader into an analog voice signal;

a second recorder which records the analog voice signal output from said D/A converter on a recording medium;

a reproduction amplifier which reproduces the analog voice signal which is recorded on said recording medium by said second recorder;

an output switching circuit switching between the analog voice signal output by said D/A converter and the analog voice signal reproduced by said reproduction amplifier, and for outputting a selected one of the analog voice signals;

a voice data input-detector which detects externally-input voice data; and an interrupter which interrupts a recording operation of said second recorder when said voice data input detector detects externally-input voice data during the recording operation of said second recorder;

wherein a recording operation of said first recorder being automatically activated when said voice-data input detector detects externally-input voice data during the recording operation of said second recorder.

13. The apparatus according to claim 12, further comprising:

a first operating member for processing the analog voice signal, a second operating member for processing the analog voice signal recorded on said recording medium, at least a portion of said first and second operating members having a common operating member, and a function selector which selects whether said common operating member operates in connection with said first operating member or said second operating member.

14. The apparatus according to claim 12, further comprising:

a speed controller for increasing a reading speed at which said data reader reads out the voice data from said solid-state memory and a running speed at which said reproduction amplifier reproduces the analog voice signal recorded on said recording medium, said increased reading and running speeds being increased as compared to a normal voice reproduction operation when the voice data recorded in said solid-state memory is recorded on said recording medium.

15. The apparatus according to claim 12, further comprising:

a detector which determines whether or not voice data is recorded in said solid-state memory when said second recorder is to perform a recording operation, and an inhibitor which stops the recording operation of the second recorder when said detector determines that no voice data is recorded in said solid-state memory.

16. The apparatus according to claim 12, further comprising an eraser mechanism which sequentially erases recorded data from said solid-state memory when a recording operating of said second recorder is being performed.

17. The apparatus according to claim 12, further comprising:

a receiver which for receives voice data which has been converted into digital signals; and a display device which displays a quantity of voice data received by said receiver;

said first recorder recording received voice data in said solid-state memory.

18. The apparatus according to claim 12, further comprising:

a proximity signal receiver which receives the proximity signal transmitted from another voice information processing apparatus;

a transfer enable signal transmitter which transmits the transfer enable signal to said another voice information processing apparatus when said proximity signal receiver receives the proximity signal; and a voice information receiver which receives the voice information from said another voice information processing apparatus, which is converted into the optical signal, in a non-contact state.

19. The apparatus according to claim 12, wherein the recording medium comprises a magnetic tape.

20. The apparatus according to claim 12, wherein said portable digital voice recorder is set on a recorder mount portion.

21. The apparatus according to claim 12, further comprising a foot-actuated switch which enables selection of a play mode, a fast-rewind mode or a stop mode.

22. An apparatus according to claim 12, wherein the externally-input voice data detected by said voice data input detecting means is digital externally-input voice data.

* * * * *

UNITED STATES PATENT AND TRADEMARK OFFICE
CERTIFICATE OF CORRECTION

PATENT NO. : 6,055,500
DATED : April 25, 2000
INVENTOR(S) : Nobuo TERUI et al.

It is certified that error appears in the above-indentified patent and that said Letters Patent is hereby corrected as shown below:

Title page,

Item [54], Title, before "INFORMATION" insert --VOICE--.

Item [56], References cited, under "U.S. PATENT DOCUMENTS" insert
--5,524,138  6/1996  Kawano........379/67--;

under "OTHER PUBLICATIONS", delete <u>first</u> occurrence of publication "Database: WPIDS....".

Signed and Sealed this

Seventeenth Day of April, 2001

Attest:

NICHOLAS P. GODICI

Attesting Officer

Acting Director of the United States Patent and Trademark Office